United States Patent
Patil et al.

(10) Patent No.: US 9,613,855 B1
(45) Date of Patent: Apr. 4, 2017

(54) METHODS OF FORMING MIS CONTACT STRUCTURES ON TRANSISTOR DEVICES IN CMOS APPLICATIONS

(71) Applicant: GLOBALFOUNDRIES Inc., Grand Cayman (KY)

(72) Inventors: Suraj K. Patil, Ballston Lake, NY (US); Zhiguo Sun, Halfmoon, NY (US); Keith Tabakman, Gansevoort, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/091,196

(22) Filed: Apr. 5, 2016

(51) Int. Cl.
  *H01L 21/768* (2006.01)
  *H01L 21/00* (2006.01)
  *H01L 21/8238* (2006.01)

(52) U.S. Cl.
  CPC .. *H01L 21/76859* (2013.01); *H01L 21/76805* (2013.01); *H01L 21/76831* (2013.01); *H01L 21/76846* (2013.01); *H01L 21/76895* (2013.01); *H01L 21/823814* (2013.01); *H01L 21/823821* (2013.01); *H01L 21/823871* (2013.01)

(58) Field of Classification Search
  CPC ............. H01L 21/768; H01L 21/76859; H01L 21/76805; H01L 21/00; H01L 21/02; H01L 21/285; H01L 21/311; H01L 21/283; H01L 21/3213; H01L 21/31111; H01L 21/32133; H01L 21/28; H01L 21/28079; H01L 21/321; H01L 21/265; H01L 21/20; H01L 21/84; H01L 21/336; H01L 21/8234; H01L 21/425

USPC .................................................. 438/233, 301
  See application file for complete search history.

(56) References Cited

U.S. PATENT DOCUMENTS

| | | | |
|---|---|---|---|
| 6,770,954 B2 | 8/2004 | Lee et al. | |
| 8,110,877 B2 | 2/2012 | Mukherjee | |
| 8,823,065 B2 | 9/2014 | Wang et al. | |
| 9,240,480 B2 | 1/2016 | Xu | |
| 2005/0121755 A1* | 6/2005 | Shin ................... | H01L 21/76877 257/669 |
| 2011/0193173 A1* | 8/2011 | Nii ................... | H01L 21/823412 257/368 |

(Continued)

OTHER PUBLICATIONS

Office Action from related U.S. Appl. No. 15/091,138 dated Dec. 15, 2016.

*Primary Examiner* — Chuong A Luu
(74) *Attorney, Agent, or Firm* — Amerson Law Firm, PLLC

(57) ABSTRACT

A method that includes, among other things, forming first and second contact openings in a layer of insulating material that respectively expose a portion of first and second source/drain (S/D) regions of first and second transistors that are of the opposite type, forming first, second and third layers of material within each of the first and second contact openings, and forming an implant masking layer that masks the first contact opening while leaving the second contact opening exposed for further processing. The method also includes forming a contact ion implant region that is positioned at least partially in at least one of the first, second or third layers of material, removing the implant masking layer and forming a conductive material in both the first and second contact openings so as to define first and second MIS contact structures positioned in the first and second contact openings.

32 Claims, 10 Drawing Sheets

(56) References Cited

U.S. PATENT DOCUMENTS

| | | | |
|---|---|---|---|
| 2013/0049091 A1* | 2/2013 | Saino | H01L 21/823842 257/310 |
| 2013/0264655 A1* | 10/2013 | Kishida | H01L 23/535 257/392 |
| 2014/0264494 A1 | 9/2014 | Xu | |
| 2015/0243661 A1 | 8/2015 | Matsumoto | |

* cited by examiner

METHODS OF FORMING MIS CONTACT STRUCTURES ON TRANSISTOR DEVICES IN CMOS APPLICATIONS

BACKGROUND OF THE INVENTION

1. Field of the Invention

The present disclosure generally relates to the fabrication of integrated circuits, and, more particularly, to various methods of forming MIS (Metal-Insulator-Semiconductor) contact structures on transistor devices in CMOS applications and the resulting transistor devices.

2. Description of the Related Art

In modern integrated circuits, such as microprocessors, storage devices and the like, a very large number of circuit elements, especially transistors, are provided and operated on a restricted chip area. Transistors come in a variety of shapes and forms, e.g., planar transistors, FinFET transistors, nanowire devices, etc. Irrespective of the physical configuration of the transistor device, each device comprises source and drain (S/D) regions and a gate electrode structure positioned above and between the S/D regions. Upon application of an appropriate control voltage to the gate electrode, a conductive channel region forms between the drain region and the source region.

Irrespective of whether a planar or non-planar device is considered, electrical connections must be formed to the device so that it may operate as intended. That is, electrical connections must be made to the source region, the drain region and the gate electrode of the device. Typically, the conductive contact structures that actually make contact with the device itself, i.e., the source region, the drain region and the gate electrode, are referred to as "contacts" within the industry. Such conductive contacts are formed in one or more layers of insulating material. The entire arrangement of the conductive contacts and the associated layer(s) of insulating material are sometimes referred to as the "contact level" of the overall electrical "wiring arrangement" that is formed to provide electrical connection to the integrated circuit device.

Historically, the formation of conductive contact structures to the source/drain (S/D) regions of a field effect transistor includes the formation of a metal silicide material on the S/D regions of the device. Such metal silicide regions are typically formed in the S/D regions so as to reduce the electrical resistance between the conductive contact structure and the S/D regions. Such metal silicide regions may be made using a variety of different refractory metals, e.g., nickel, platinum, titanium, cobalt, etc., including combinations of such materials, and they may be formed using techniques that are well known to those skilled in the art. One illustrative prior art process flow that was performed to form such metal silicide regions within a contact opening or a trench included the following: (1) depositing a layer of insulating material above the device including the S/D regions; (2) forming contact openings in the layer of insulating material so as to expose a portion of the S/D regions; (3) depositing a layer of refractory metal (e.g., Ni, NiPt) within the contact openings and on and in contact with the exposed portions of the S/D regions; (4) forming a capping layer (e.g., TiN) on the layer of refractory metal; (5) performing an initial heating process causing the refractory metal to react with underlying silicon-containing material in the S/D regions and form an initial form of the metal silicide material that has a relatively high electrical resistance; (6) performing an etching process to remove unreacted portions of the layer of refractory metal; (7) performing an additional heating process to form a final, lower resistance phase of the metal silicide material; and (8) performing an additional stripping process to remove any unreacted materials. Another prior art metal silicide formation technique involves (1) formation of a layer of refractory metal (e.g., Ti) on the S/D region; (2) depositing a capping layer (e.g., TiN) on the layer of refractory metal; and (3) performing an RTA laser-based anneal process.

However, as device technology continues to advance, the above-described formation of metal silicide regions as part of the conductive S/D contact structures has become more problematic for several reasons. For example, advanced devices (both planar and FinFET devices) may be manufactured using materials other than traditional silicon, such as, for example, silicon germanium, germanium, III-V materials, which may suffer from higher S/D contact resistance as compared to traditional silicon-based devices. Additionally, the ongoing decrease in device dimensions has also mandated an associated decrease in physical size of the contact openings and the conductive S/D contact structures that are formed to establish electrical connections to, for example, the S/D regions. The formation of the initial lower-resistance phase metal silicide material in such reduced-size contact openings can be difficult. Moreover, to convert the initial relatively higher resistance form of the metal silicide material into the more desirable lower resistance phase of the metal silicide material requires performing an additional heating process that reduces the overall thermal budget available for forming the entire device, and, in some cases, may lead to the formation of non-continuous layers of metal silicide regions and/or agglomeration of the metal silicide material.

With respect to some particular metal silicide materials, certain particularized problems may arise. For example, with respect to titanium silicide (TiSi), an interfacial oxide material tends to form between the titanium silicide and the underlying substrate material, thereby increasing contact resistance which leads to a reduction in device performance. In the case of other silicide materials, such as nickel silicide (NiSi) or nickel platinum silicide (NiPtSi), the metal silicide material may diffuse or form in undesired locations on the device, i.e., the silicide material may encroach toward the gate structure. Such undesired encroachment by such metal silicide materials can lead to electrical shorts, increase leakage currents, etc., all of which may lead to device and yield degradation. Cobalt di-silicide materials ($CoSi_2$) are difficult to reliably form on substrate materials that comprise germanium, such as silicon germanium ($Si_{(1-x)}Ge_x$), because germanium is soluble in cobalt mono-silicide (CoSi) and immiscible in cobalt di-silicide ($CoSi_2$), which results in the movement of germanium away from the SiGe lattice and leads to agglomeration, which increases the contact resistance and reduces channel mobility. Lastly, attempts to implant relatively large ions (e.g., arsenic (As), antimony (Sb) and selenium (Se)) into the underlying epi material in a source/drain region and/or within the metal silicide material leads to processing complexity and may lead to the reducing of desirable stress profiles, e.g., tensile or compressive, in the epi and channel region of the device, which can reduce device performance.

Device designers have explored using different contact methods and structures to improve the operational characteristics of the devices and/or to simplify processing techniques. For example, U.S. Pat. No. 8,110,887 is an example of an MIS (Metal-Insulator-Semiconductor) contact structure for transistor devices. However, what is needed for modern, high packing density applications is a method of forming MIS contact structures that is more efficient and effective in terms of its use of space and the formation of a lower resistance structure for various transistor devices.

The present disclosure is directed to various methods of forming MIS contact structures on transistor devices in CMOS applications and the resulting transistor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming MIS contact structures for semiconductor devices in CMOS applications and the resulting semiconductor devices. One illustrative method disclosed herein includes, among other things, forming first and second contact openings in a layer of insulating material, the first contact opening exposing a portion of a first source/drain (S/D) region of a first transistor, the second contact opening exposing a portion of a second S/D region of a second transistor of an opposite type to the first transistor, and performing a plurality of conformal deposition processes to form first, second and third layers of material within each of the first and second contact openings, wherein the first layer comprises a contact insulating material, the second layer comprises a metal-containing material and the third layer comprises a conductive cap material, wherein the third layer is positioned above the second layer in both the first and second contact openings. The method also includes forming an implant masking layer that masks the first contact opening while leaving the second contact opening exposed for further processing, performing a contact ion implantation process through the implant masking layer to form a contact ion implant region comprising a contact ion that is positioned at least partially in at least one of the first, second or third layers of material positioned within the second contact opening, removing the implant masking layer, forming a fourth layer of material comprising a conductive material above the third layer in both the first and second contact openings and removing portions of the first, second, third and fourth layers of material positioned outside of the first and second contact openings to define a first MIS contact structure positioned in the first contact opening and a second MIS contact structure positioned in the second contact opening.

Another illustrative method disclosed herein includes, among other things, forming first and second contact openings in a layer of insulating material that respectively expose portions of first and second source/drain (S/D) regions of first and second transistors, respectively, and performing a plurality of conformal deposition processes to form first, second and third layers of material within each of the first and second contact openings, wherein the first layer comprises one of zirconium oxide or hafnium oxide. In this example, the method also includes forming an implant masking layer that masks the first contact opening while leaving the second contact opening exposed for further processing, performing a contact ion implantation process through the implant masking layer to form a contact ion implant region comprising a contact ion that is positioned at least partially in at least one of the first, second or third layers of material positioned within the second contact opening, removing the implant masking layer, forming a fourth layer of material comprising a conductive material above the third layer in both the first and second contact openings such that the fourth layer overfills the first and second contact openings, and performing at least one process operation to remove materials positioned outside of the first and second contact openings to define a first MIS contact structure positioned in the first contact opening and a second MIS contact structure positioned in the second contact opening, wherein the first and second MIS contact structures consist of the same materials arranged in the same order within each of the first and second MIS contact structures.

BRIEF DESCRIPTION OF THE DRAWINGS

The disclosure may be understood by reference to the following description taken in conjunction with the accompanying drawings, in which like reference numerals identify like elements, and in which.

Figure 1A:
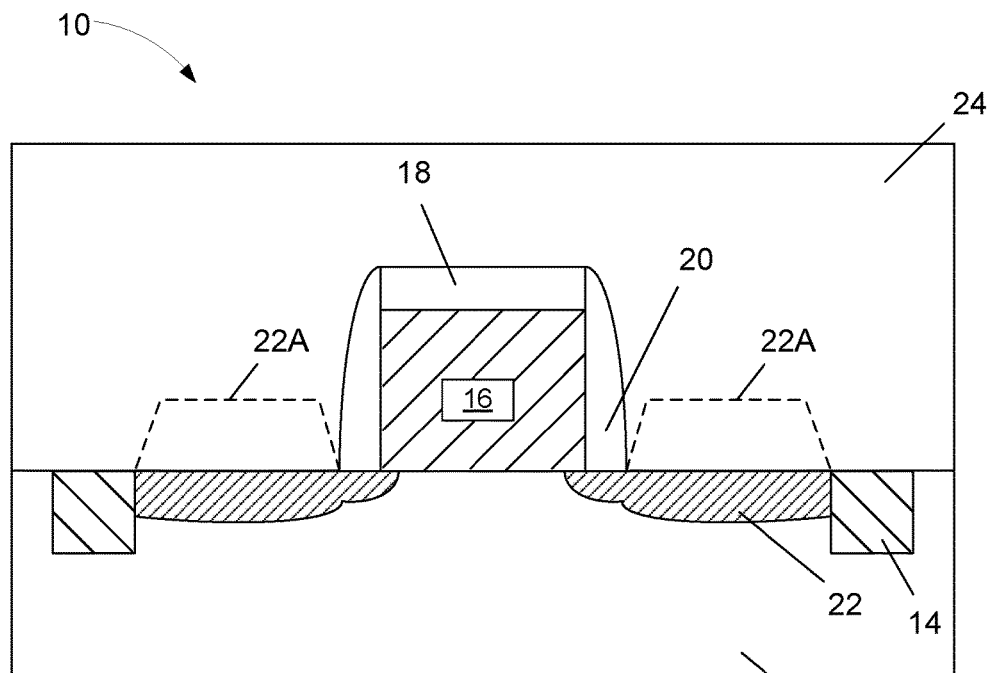
FIGS. 1A-1P depict various illustrative methods disclosed herein for forming MIS (Metal-Insulator-Semiconductor) contact structures on transistor devices and the resulting transistor devices for both single devices and multiple devices in CMOS applications.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming MIS contact structures on transistor devices in CMOS applications and the resulting transistor devices. As will be readily apparent to those skilled in the art upon a complete reading of the present application, the disclosed methods may be employed when forming a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different integrated circuit products, e.g., memory products, logic products, ASICs, etc. With reference to the attached drawings, various illustrative embodiments of the methods disclosed herein will now be described in more detail.

As will be appreciated by those skilled in the art after a complete reading of the present application, the inventions disclosed herein may be employed in forming integrated circuit products using planar transistor devices, as well as so-called 3D devices, such as FinFETs, nanowire devices, etc. For purposes of disclosure, reference will be made to an illustrative process flow wherein an illustrative planar transistor device is formed. However, the inventions disclosed herein should not be considered to be limited to such an illustrative example. With reference to the attached figures, various illustrative embodiments of the methods and devices disclosed herein will now be described in more detail. The gate structure for the device may be formed using either so-called "gate-first" or "replacement gate" ("gate-last" or "gate-metal-last") techniques. The various components and structures of the device 10 disclosed herein may be formed using a variety of different materials and by performing a variety of known techniques, e.g., a chemical vapor deposition (CVD) process, a physical vapor deposition (PVD) process, an atomic layer deposition (ALD) process, a thermal growth process, spin-coating techniques, etc. The thicknesses of these various layers of material may also vary depending upon the particular application.

FIG. 1A is a simplified view of the illustrative transistor device 10 at an early stage of manufacturing. The device 10 is formed in an active region of a semiconductor substrate 12 that is defined by a simplistically depicted trench isolation region 14. The substrate 12 may have a variety of configurations, such as the depicted bulk silicon configuration. The substrate 12 may also have a semiconductor-on-insulator (SOI) configuration that includes a bulk semiconductor layer (e.g., silicon), a buried insulation layer and an active layer, wherein semiconductor devices are formed in and above the active layer. The substrate 12 may be made of silicon or it may be made of materials other than silicon. Thus, the terms "substrate" or "semiconductor substrate" should be understood to cover all semiconducting materials and all forms of such materials. In the case where the device 10 is, for example, a FinFET device, the substrate 12 may take the form of a fin, wherein the cross-sectional view depicted in FIG. 1A is taken through the long axis of the fin in a direction corresponding to the current transport or gate length direction of the device 10.

With continuing reference to FIG. 1A, the device 10 also includes a simplistically depicted gate structure 16, a gate cap 18 (e.g., silicon nitride), a sidewall spacer 20, a plurality of S/D regions 22 and an illustrative layer of insulating material 24. In some applications, the S/D regions 22 may also have additional epi semiconductor material 22A (depicted in dashed lines in FIG. 1A only) that is formed in or above the substrate 12 in the source/drain areas of the device 10. The S/D regions 22 may be doped with appropriate S/D dopant ions. The S/D dopant ion that is used for the device 10 will vary depending upon the type of device under construction. For example, in the case where the device 10 is an N-type device, the S/D regions 22 may be doped with N-type dopant ions such as arsenic or phosphorous. In the case where the device 10 is a P-type device, the S/D regions 22 may be doped with P-type dopant ions such as boron or boron difluoride. In some cases, the S/D dopant ions may be introduced into the S/D regions 22 by performing one or more ion implantation processes. In other cases, the S/D dopant ions may be introduced into epi semiconductor material formed in the S/D regions 22 in situ, i.e., as the epi semiconductor material is being formed. Although the layer of insulating material 24 is simplistically depicted as being a single layer of material, in practice, the layer of insulating material 24 may be comprised of a plurality of layers of insulating material, perhaps with an intervening etch stop layer formed between such layers of material. Additionally, various doped regions, e.g., halo implant regions, well regions and the like, are also not depicted in the attached drawings. A thin contact etch stop layer (not shown) may also be formed on the device prior to the formation of the layer of insulating material 24. The gate structure 16 is representative in nature of any type of gate structure used in manufacturing semiconductor devices. The gate structure 16 may be manufactured using either gate-first or replacement gate techniques.

Figure 1B:
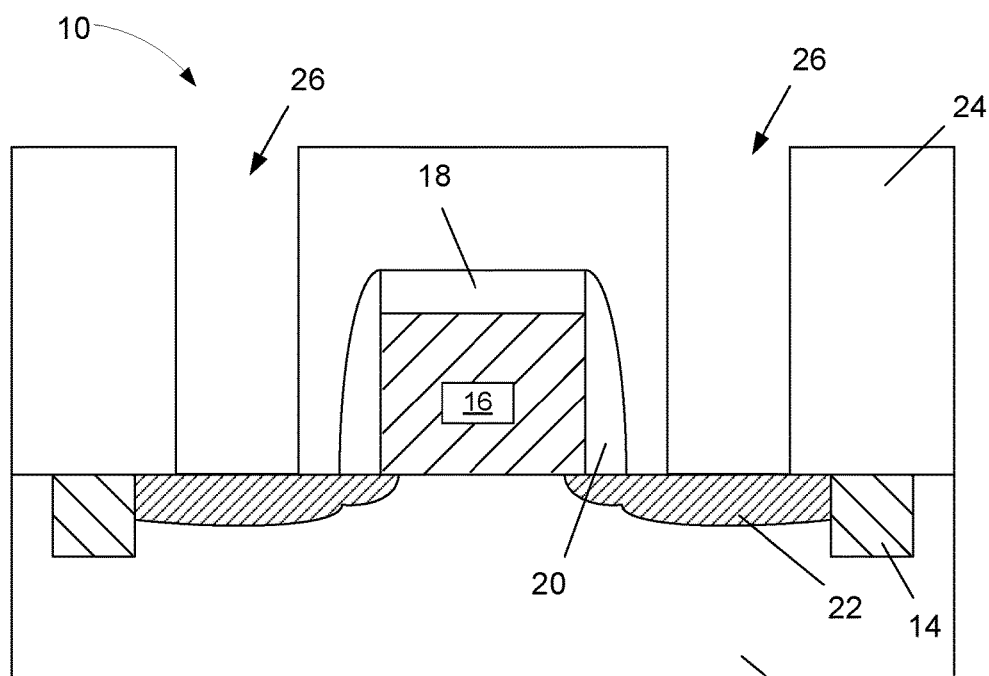

FIG. 1B depicts the device 10 after one or more etching processes were performed through a patterned etch mask (not shown), such as a patterned layer of photoresist or a patterned hard mask layer, to define illustrative S/D contact openings or trenches 26 in the layer of insulating material 24 that expose a portion of the underlying S/D regions 22. The size and shape of the S/D contact openings 26 may vary depending upon the particular application. For example, the S/D contact openings 26 may be discreet point-type contacts having a square or circular configuration (when viewed from above) or they may be line-type features that span the entire length of the S/D regions 22 in a direction corresponding to the gate width direction of the device 10, i.e., into and out of the plane of the drawing page. In current day devices, the lateral width (or critical dimension) of the S/D contact openings 26 (in the gate length direction of the device 10) may be as small as about 10-30 nm, and further reductions in size are expected in future generation devices. Of course, as will be appreciated by those skilled in the art after a complete reading of the present application, the methods disclosed herein may be employed when forming traditional S/D contact structures that are formed in S/D contact openings etched into a layer of insulating material as well as when forming so-called self-aligned contacts wherein the conductive S/D contact structure lands on or above the gate cap 18 as well as the sidewall spacer 20 on two adjacent transistor devices.

Figure 1C:
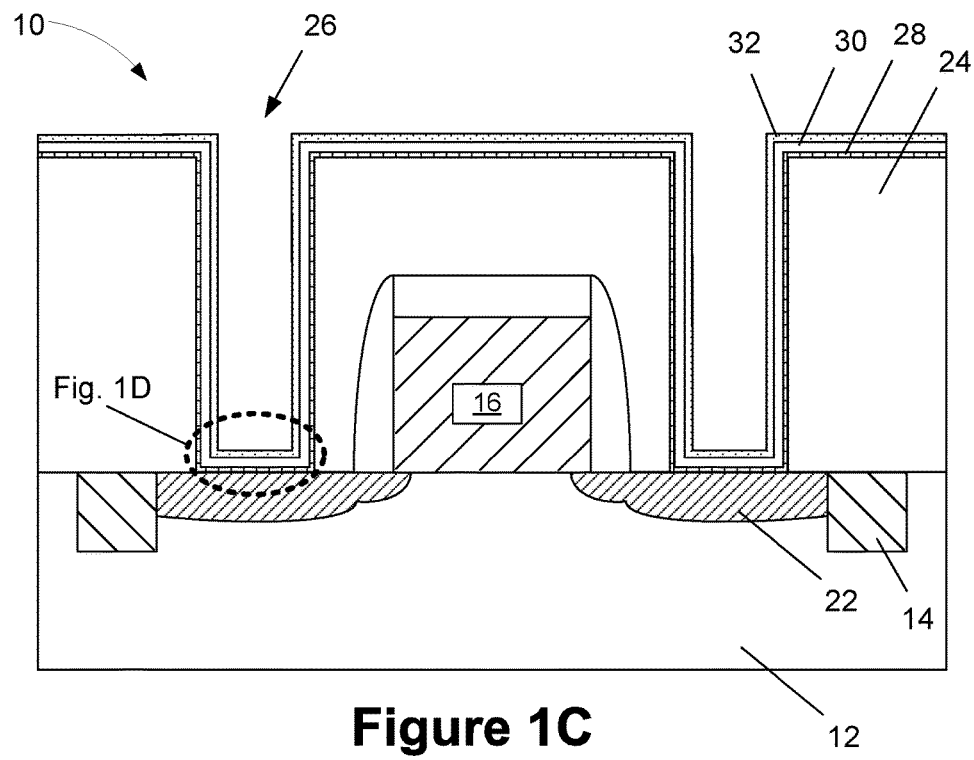
Figure 1D:
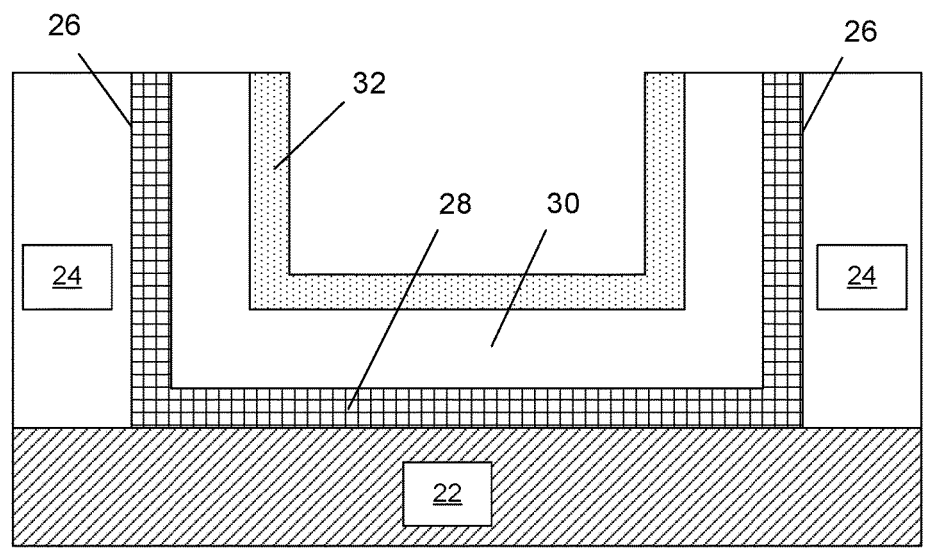
Figure 1E:
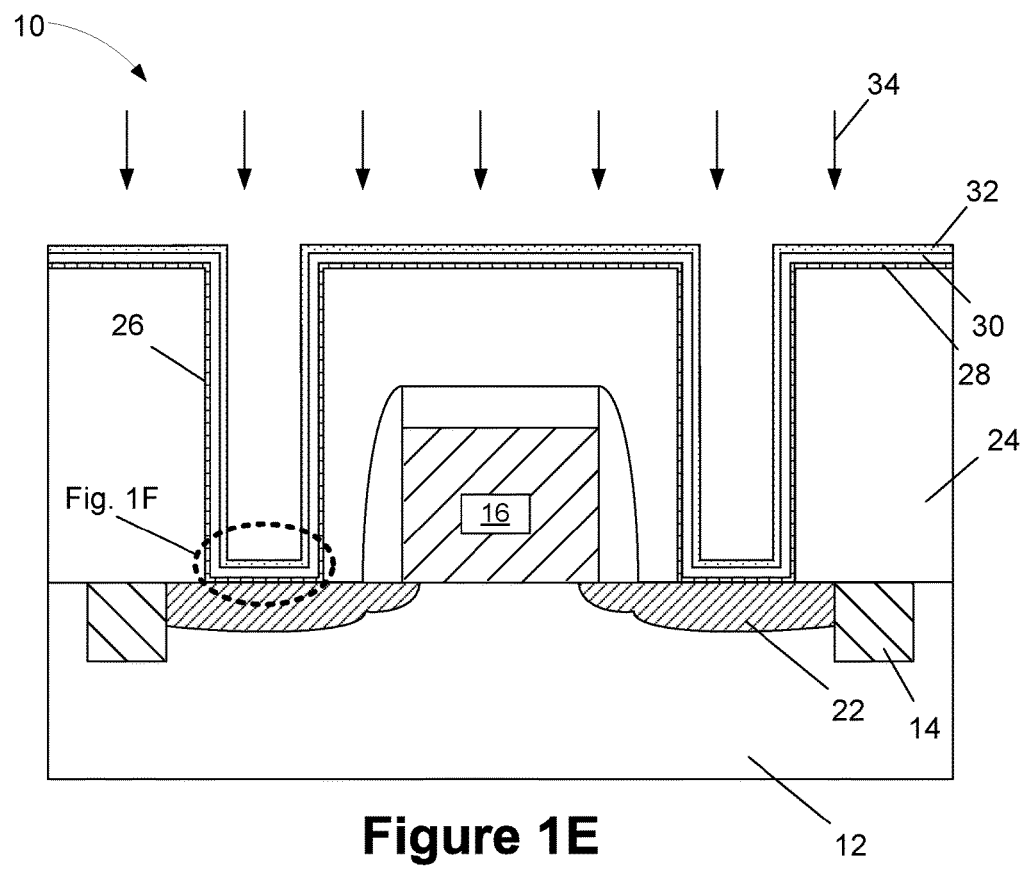
Figure 1F:
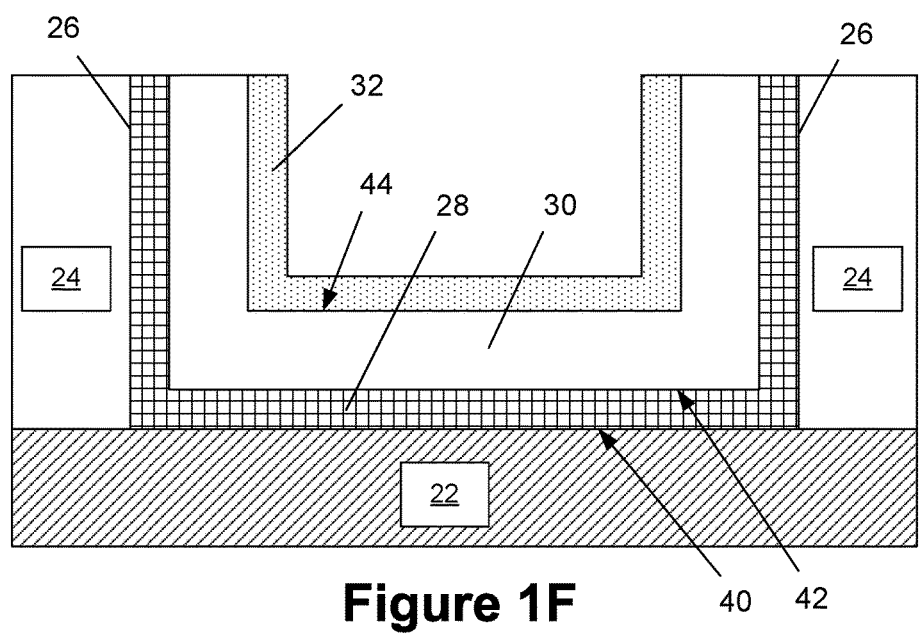
Figure 1G:
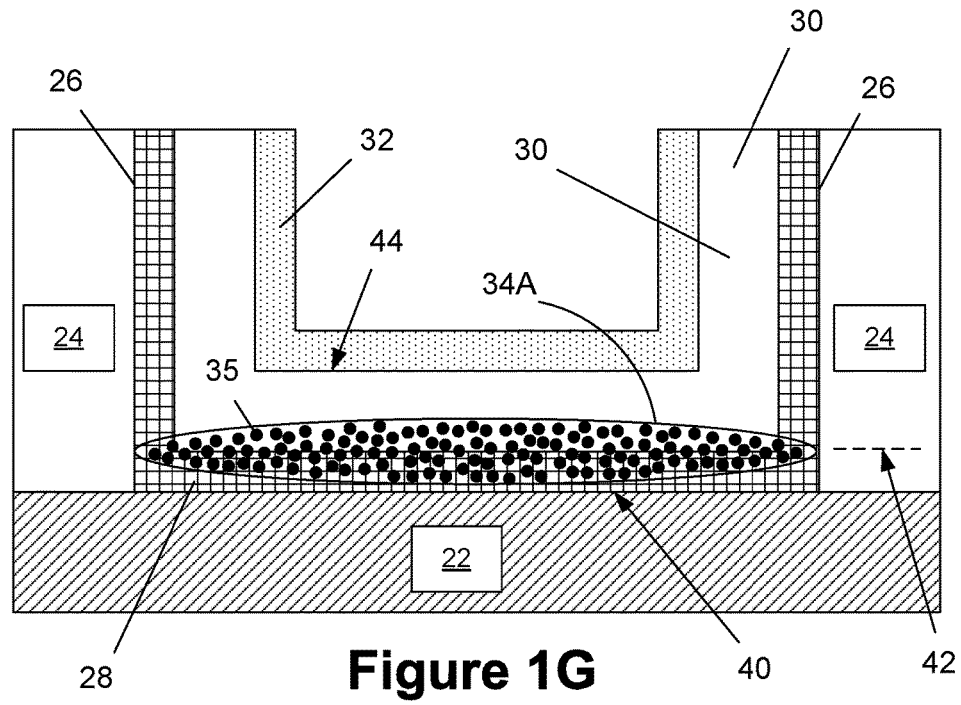
Figure 1H:
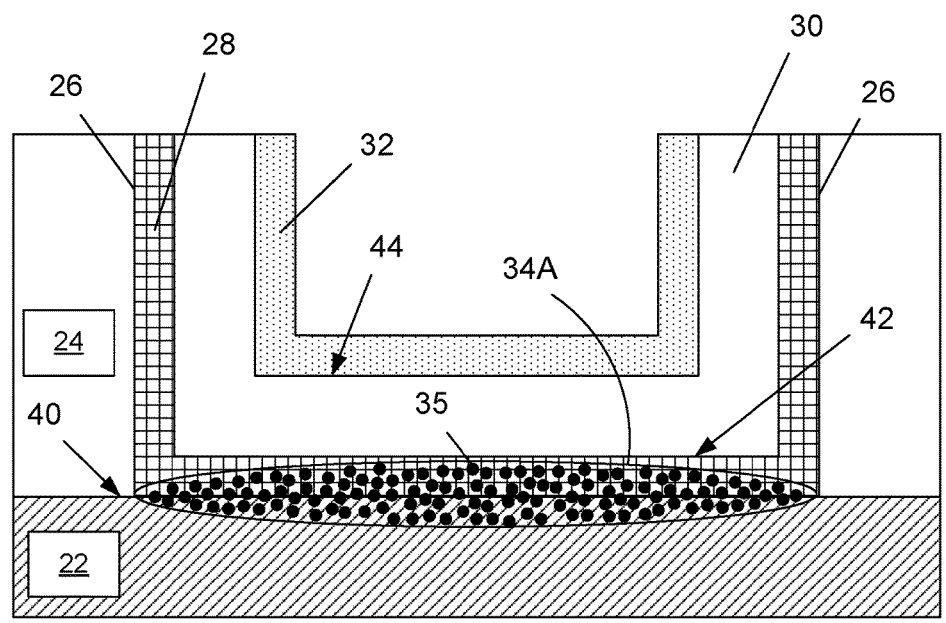

FIGS. 1C-1D depict the device 10 after several layers of material were formed in the contact openings 26 above the S/D regions 22. More specifically, in one illustrative embodiment, a layer of contact insulating material 28 (for the MIS contact structure), a metal-containing layer 30 and a conductive cap layer 32 were sequentially formed in the S/D contact openings 26. In one illustrative embodiment, each of the layers 28, 30 and 32 may be formed by performing a conformal process, such as, for example, ALD, CVD, PVD, electroplating, etc. The layer of contact insulating material 28 may be comprised of a variety of different materials, e.g., a high-k insulating material (k value of 10 or greater), such as zirconium oxide ($ZrO_2$), hafnium oxide ($HfO_2$), hafnium zirconium oxide ($HfZrO_x$), $HfSiO_xN_y$, niobium oxide ($Nb_xO_y$), cerium oxide ($CeO_2$), tantalum oxide ($Ta_2O_5$), titanium tantalum oxide ($TiTa_xO_y$), strontium titanate ($SrTiO_3$), aluminum oxide ($Al_2O_3$), lanthanum oxide ($La_2O_3$), nickel oxide (NiO), titanium oxide ($TiO_2$), zinc oxide (ZnO), etc., and combinations of such materials. The layer of contact insulating material 28 may be formed to any desired thickness, e.g., 0.5-2 nm. The conductive metal-containing layer 30 may be comprised of a variety of different materials, e.g., a refractory metal, such as titanium, nickel, platinum, cobalt, iridium, ruthenium, tungsten, tantalum or combinations of such materials, etc., a metal alloy, $Ni_xPt_y$, $Ni_xCo_y$, tungsten nitride (WN), etc., and it may be formed to any desired thickness, e.g., 2-8 nm. In one illustrative embodiment, the metal-containing layer 30 may be made of an "N-type metal-containing layer of material"—a term which as used herein and in the attached claims, shall be understood to mean a material that has a Schottky barrier height that falls within the range of 0.3-0.64 eV (which as used herein and in the attached claims shall be understood to include the range endpoints) relative to n-Si and/or a corresponding work function between 3.7-4.3 eV (which as used herein and in the attached claims shall be understood to include the range endpoints). In another illustrative embodiment, the metal-containing layer 30 may be made of a "P-type metal-containing layer of material"—a term which as used herein and in the attached claims, shall be understood to mean a material that has a Schottky barrier height that falls within the range of 0.65-0.9 eV (which as used herein and in the attached claims shall be understood to include the range endpoints) and/or a corresponding work function between 4.4-5.2 eV (which as used herein and in the attached claims shall be understood to include the range endpoints). The conductive cap layer 32 may be comprised of any of a variety of different conductive materials, e.g., a metal, a metal alloy, such as titanium nitride, nickel nitride, or a combination of electrically conductive metal nitrides, etc., and it may be formed to any desired thickness, e.g., 1-3 nm.

With reference to FIGS. 1E-1I, the next major process operation involves performing a contact ion implantation process 34 so as to define a shallow contact ion implant region 34A comprised of contact implant ions 35 in or above one or more of the layers of material formed in the contact opening 26, i.e., the contact insulating material 28, the metal-containing layer 30 and the cap layer 32. No attempt has been made to depict the contact ion implant region 34A in FIGS. 1E-1F. With reference to the enlarged portion of the device shown in FIG. 1F, there is an interface 40 between the layer of contact insulating material 28 and the S/D regions 22, an interface 42 between the metal-containing layer 30 and the layer of contact insulating material 28 and an interface 44 between the metal-containing layer 30 and the conductive cap layer 32. Note that the contact ion implant process 34 is performed after all of the dopant materials (P-type or N-type) have been introduced into the S/D regions 22 of the device.

Figure 1I:
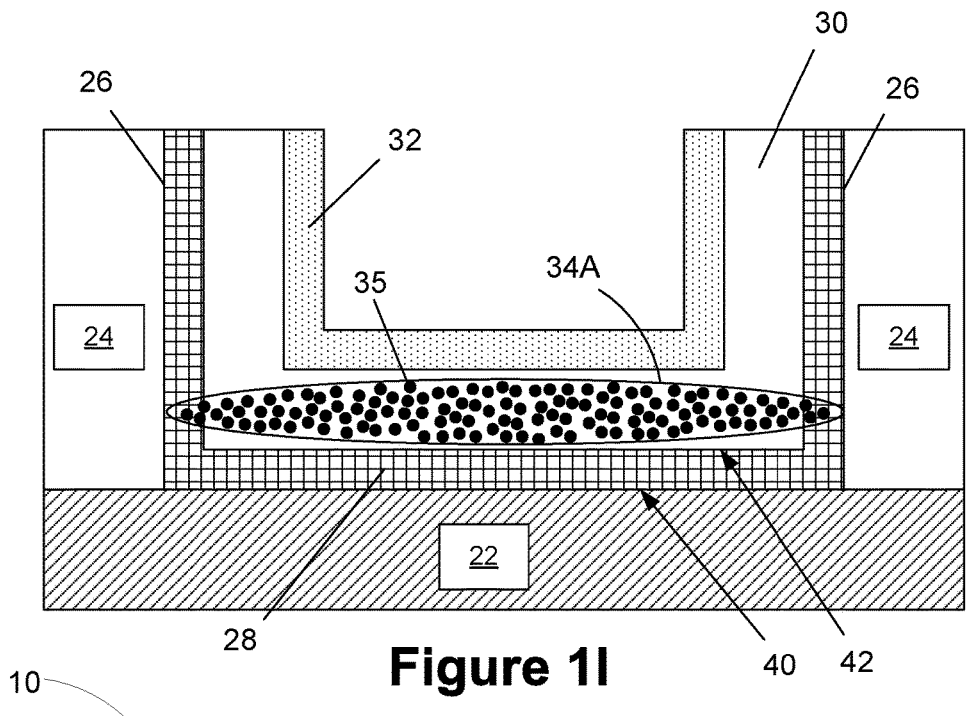

The contact ion implantation process 34 may be performed under conditions such that the depth of peak concentration of the contact ion implant region 34A may be positioned at any desired level within the stack of material layers 28, 30 and 32, including at any interface between any of the layers 28, 30 and 32. In the example depicted in FIG. 1G, the contact ion implantation process 34 was performed under conditions such that the target depth for the location of peak concentration of the ions 35 in the contact ion implant region 34A was approximately at the interface 42 between the metal-containing layer 30 and the layer of contact insulating material 28. In the example depicted in FIG. 1H, the contact ion implantation process 34 was performed under conditions such that the target depth for the location of peak concentration of the ions 35 in the contact ion implant region 34A was approximately the interface 40 between the layer of contact insulating material 28 and the substrate 12, S/D regions 22. FIG. 1I depicts yet another example wherein the contact ion implantation process 34 was performed under conditions such that the target depth for the location of peak concentration of the ions 35 in the contact ion implant region 34A was approximately mid-thickness of the metal-containing layer 30.

The dose of the contact ions 35 used during the contact ion implantation process 34 as well as the energy level of the contact ion implantation process 34 may vary depending upon the particular application. In one illustrative embodiment, the contact ion implantation process 34 may be performed with a dose of contact ions 35 that falls within the range of about $1 \times 10^{14}$-$1 \times 10^{15}$ ion/cm$^2$ at an energy level that falls within the range of about 0.1-10 keV. In one illustrative embodiment, the resulting contact ion implant region 34A may have a concentration of ions 35 that falls within the range of about $1 \times 10^{15}$-$1 \times 10^{17}$ ions/cm$^3$. The particular ions 35 implanted during the contact ion implantation process 34 may vary depending upon the particular application. For example, phosphorous (P), silicon (Si), antimony (Sb), magnesium (Mg), arsenic (As) or other materials may be implanted on N-type devices, while aluminum (Al), nickel (Ni), nitrogen (N), nickel (Ni), gallium (Ga) or platinum (Pt) or other materials may be implanted on P-type devices. In one particular embodiment, the contact implant ions 35 for the N-type devices may be a different ion than the N-type dopant ions used in doping the N-type S/D regions. Similarly, in one embodiment, the contact implant ions 35 for the P-type devices may be different ion than the P-type dopant ions used in doping the P-type source/drain regions.

In general, P-type devices operate in the valence band of silicon while N-type devices operate in the conduction band of silicon. The metals that are conducive to forming good contacts to N-type devices generally have an energy level that is near the conduction band of silicon, i.e., an N-type metal-containing layer of material with a low Schottky barrier height, which may be considered to be N-friendly type materials. Conversely, contact metals that are conducive to forming good contacts to P-type devices generally have an energy level that is near the valence band of silicon, i.e., a P-type metal-containing layer of material with a high Schottky barrier height, which may be considered to be P-friendly type materials. In general, some contact metals form better contacts, i.e., contacts with a lower Schottky barrier potential to one type of device (N or P) as compared to the other type of device. For example, an N-type metal-containing layer of material, such as a titanium-based contact material, is a good contact metal for forming conductive contacts on an N-type device, but, in a relative sense, a poorer contact metal for forming conductive contacts to a P-type device, i.e., the contact that is formed on a P-type device with such an N-type metal-containing layer of material (such as a titanium-based material) has a greater Schottky barrier potential as compared to the titanium-based contact formed on an N-type device. As another example, a P-type metal-containing layer, such as a platinum-based contact material, is a good contact metal for forming conductive contacts on a P-type device, but, in a relative sense, a poorer contact metal for forming conductive contacts to an N-type device, i.e., the contact that is formed on the N-type device with a P-type metal-containing layer (such as a platinum-based material) has a greater Schottky barrier potential as compared to the platinum-based contact formed on an N-type device. In general, in one embodiment, the ions 35 selected for implantation into the N-type devices will tend to lower the Schottky barrier potential for the N-type devices. Similarly, the ions 35 selected for implantation into the P-type devices will tend to lower the Schottky barrier potential of the P-type devices.

Figure 1J:
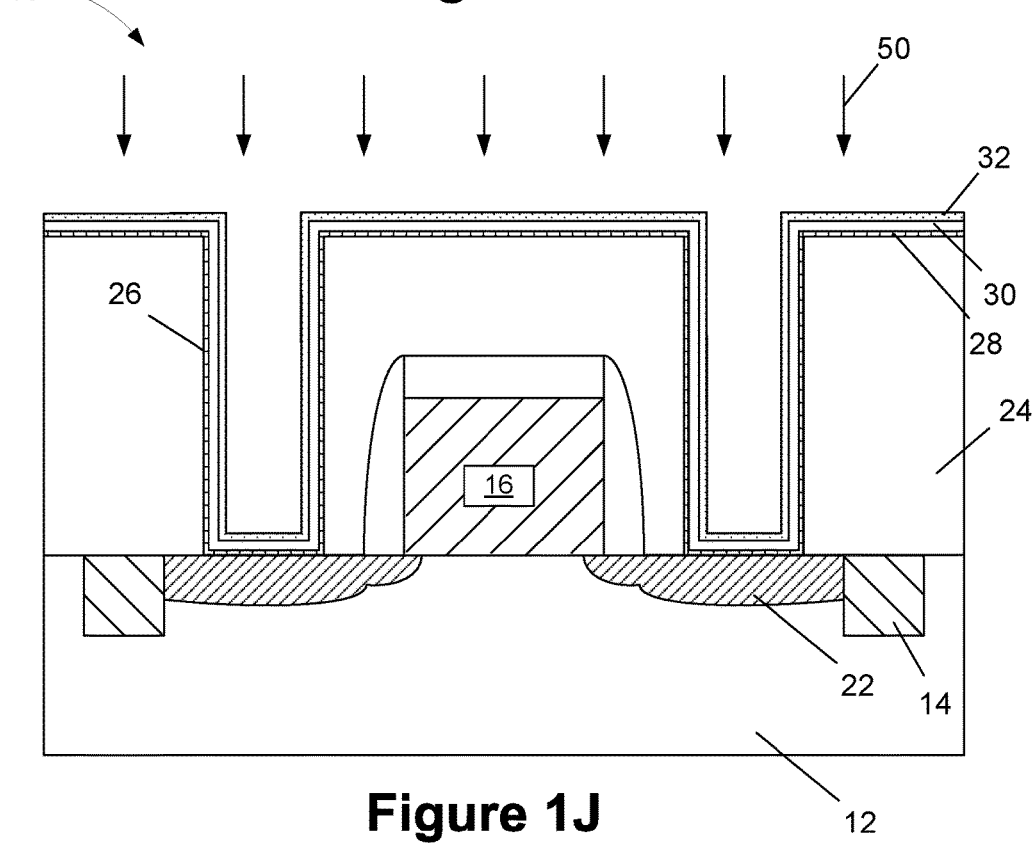

FIG. 1J depicts the device after an anneal process 50, e.g., an RTA (rapid thermal anneal) process or a laser spike anneal process, was performed on the product. The anneal process 50 may be performed at a temperature of about 250-850° C. and for a duration of about 0.1 msec-180 seconds in an inert atmosphere depending upon the anneal technique selected and the materials used. No attempt has been made to show the contact ion implant region 34A in FIG. 1J and no attempt has been made in any drawings to show any post-anneal migration of the ions 35 in the contact ion implant region 34A.

Figure 1K:
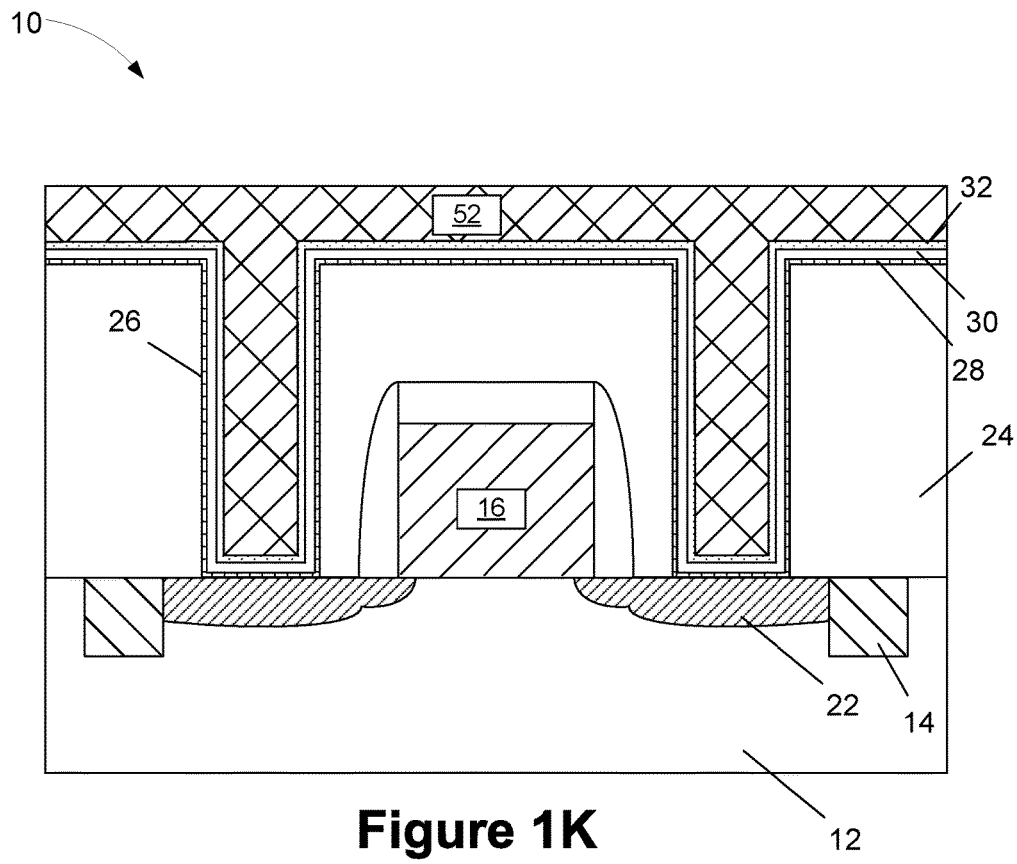

FIG. 1K depicts the device 10 after a conductive material 52, e.g., copper, tungsten, cobalt, nickel, doped polysilicon, etc., was deposited to overfill the contact openings 26. In one illustrative embodiment, the conductive material 52 may be formed by performing any of a variety of known processes, e.g., ALD, CVD, PVD, electroplating etc. No attempt has been made to show the contact ion implant region 34A in FIG. 1K. If desired, the above-described anneal process 50 may be performed after the formation of the conductive material 52.

Figure 1L:
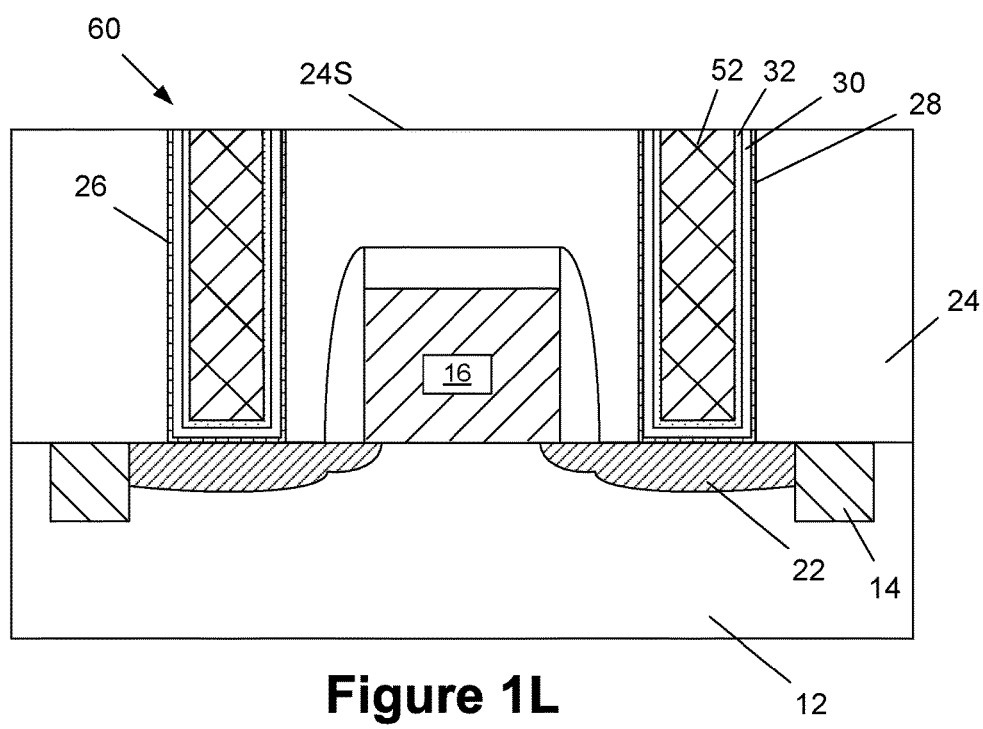

FIG. 1L depicts the device 10 after one or more chemical mechanical polishing (CMP) operations were performed to remove the excess amounts of the various materials positioned above the upper surface 24S of the layer of insulating material 24. These operations result in the formation of the finished MIS contact structure 60 that is positioned within the contact openings 26 and establishes electrical contact to the underlying S/D regions 22. No attempt has been made to show the contact ion implant region 34A in FIG. 1L.

At the point of processing depicted in FIG. 1L, additional so-called "metallization layers (not shown) that constitute the overall wiring pattern for the integrated circuit product that includes the device 10 may be formed or stacked above the layer of insulating material 24. Each of these metallization layers is typically comprised of a layer of insulating material (not shown) with conductive metal lines and/or conductive vias formed in the layer of insulating material. Generally, the conductive lines provide the intra-level (i.e., within layer) electrical connections, while the conductive vias provide the inter-level connections or vertical connections between different metallization layers or levels. These conductive lines and conductive vias may be comprised of a variety of different materials, e.g., copper, with appropriate barrier layers, etc. The first metallization layer in an integrated circuit product is typically referred to as the "M1" layer, while the conductive vias that are used to establish electrical connection between the M1 layer and lower level conductive structures that physically contact the devices are typically referred to as "V0" vias. For current advanced integrated circuit products, the conductive lines and conductive vias in these metallization layers are typically comprised of copper, and they are formed in layers of insulating material using known damascene or dual-damascene techniques. A conductive structure in one of these metallization layers, such as a conductive via (not shown) may be formed so as to establish an electrical connection to the MIS contact structure 60.

Figure 1M:
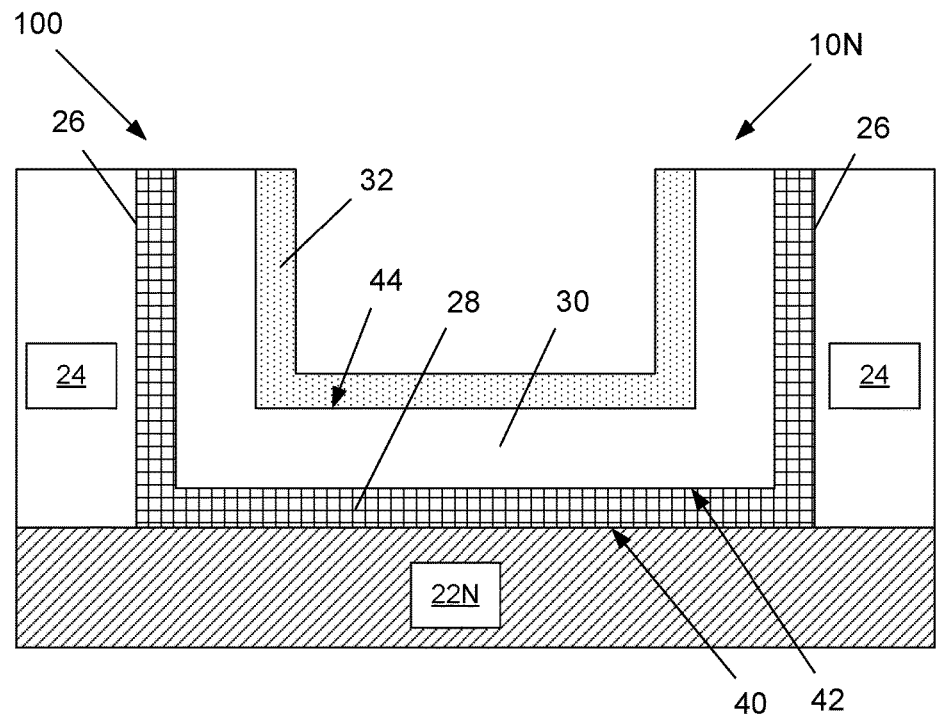
Figure 1M:
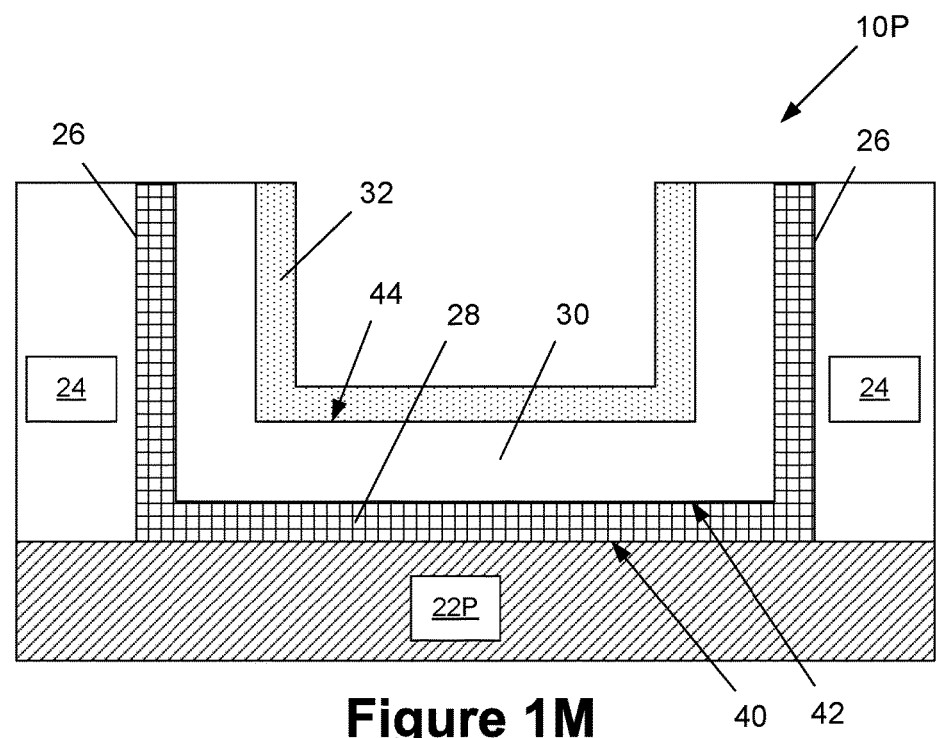

The methods disclosed herein may also be employed on integrated circuit products that are manufactured using CMOS technology, i.e., products that include both N-type transistor devices and P-type transistor devices. FIG. 1M is a view of a portion of an integrated circuit product comprised of an N-type device 10N (upper portion of FIG. 1M) and a P-type device 10P (lower portion of FIG. 1M), wherein only the enlarged area shown in FIG. 1D is depicted for each of the devices 10N, 10P. In one illustrative embodiment, the semiconductor substrate 12 for the N-type device 10N may be phosphorus doped silicon-germanium and N-doped S/D regions 22N may be formed on the N-type device 10N. On the other hand, the semiconductor substrate 12 for the P-type device 10P may be boron doped silicon-germanium (e.g., $Si_{(1-x)}Ge_x$) and P-doped S/D regions 22P may be formed on the P-type device 10P.

With continuing reference to FIG. 1M, in one illustrative embodiment, the layer of contact insulating material 28 may be comprised of the same material, e.g., zirconium oxide, hafnium oxide for both the N-type device 10N and the P-type device 10P, although such a configuration may not be present in all CMOS applications. Similarly, in some cases, the metal-containing layer 30 may be comprised of the same material for both the N and P devices, e.g., an N-type metal-containing layer of material 30 that is formed for both the N-type device 10N and the P-type device 10P in a CMOS application or a P-type metal-containing layer 30 that is formed for both the N-type device 10N and the P-type device 10P in a CMOS application. In other CMOS applications, the composition of the metal-containing layer 30 may be different on the N-type device 10N and the P-type device 10P. For example, in one embodiment, the metal-containing layer 30 on the N-type device 10N may be an N-type metal-containing layer 30 made of, for example, titanium, while the metal-containing layer 30 on the P-type device 10P may be a P-type metal-containing layer 30 made of, for example, nickel, platinum or gallium. Appropriate masking layers would be formed to cover the P-type devices when forming the N-type metal-containing layer 30 for the N-type devices, and vice-versa when forming the P-type metal-containing layer 30 for the P-type devices.

Figure 1N:
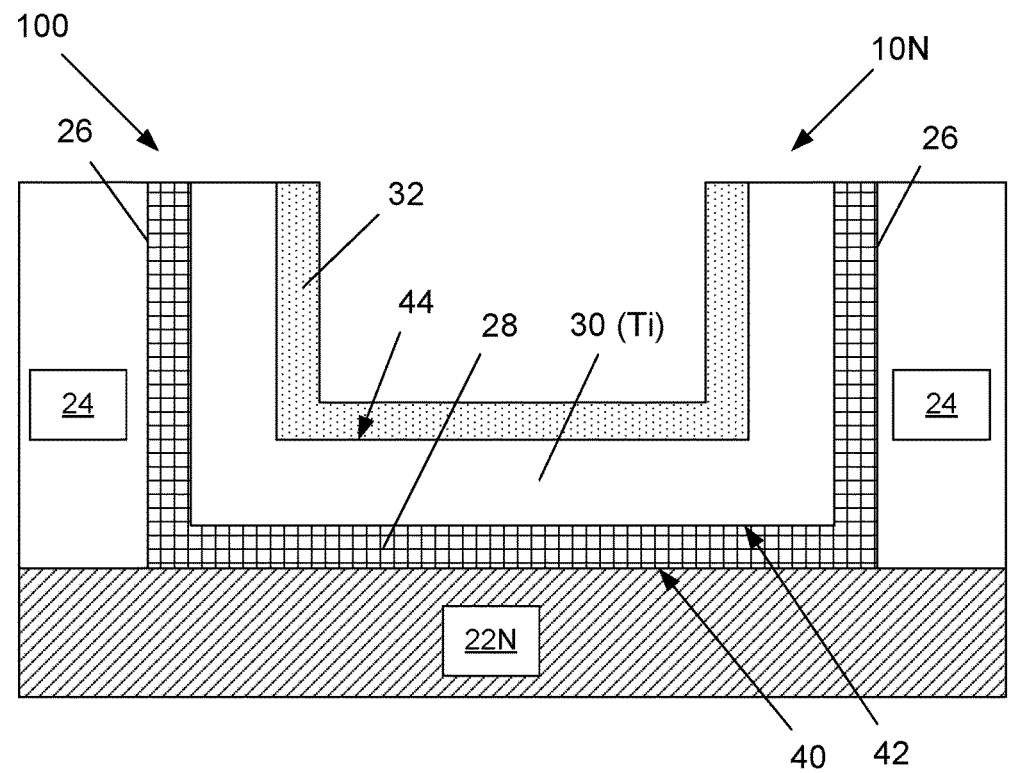
Figure 1N:
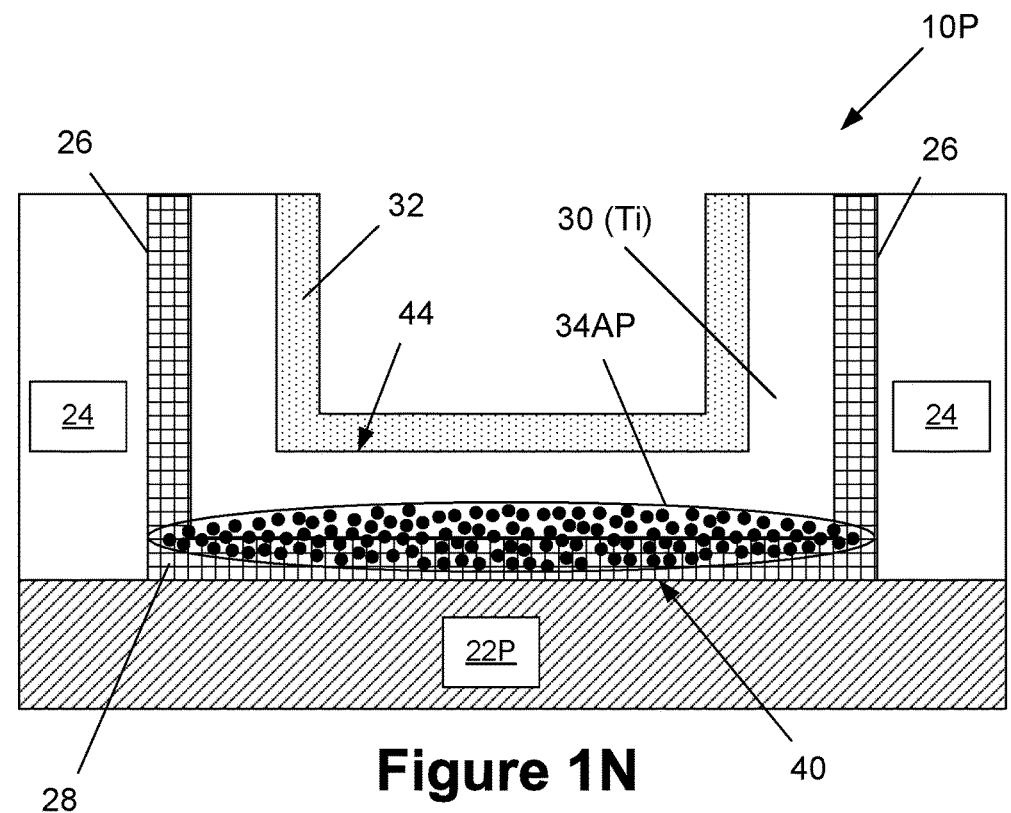

As depicted in FIG. 1M, and as noted above, in one unique process flow for CMOS applications, the metal-containing layer 30 may be the same for both the N-type device 10N and the P-type device 10P, e.g., a layer of titanium or a layer of nickel. After forming of the conductive cap layer 32 on both the N-type and P-type devices, one of the device types may be masked and the contact ion implantation process 34 (described above) may be performed on the unmasked type devices. For example, FIG. 1N depicts an example where the metal-containing layer 30 in both the N-type devices 10N and the P-type devices 10P is made of an N-type metal-containing layer of material (an N-friendly material) such as titanium. After the formation of the capping layer 32, an implant masking layer (not shown) may be formed so as to mask the N-type devices 10N. Thereafter, the above-described contact ion implantation process 34 may be performed using P-type ions 35, such as aluminum or nickel, to form the depicted contact ion implant regions 34AP on the P-type devices 10P. The location of the peak concentration of ions 35 in the contact ion implant regions 34AP shown in FIG. 1N (e.g., approximately at the interface 42 between the metal-containing layer 30 and the layer of contact insulating material 28) is just by way of example only. Thereafter, the masking layer that covered the N-type devices 10N during the contact ion implantation process 34 may be removed and processing may be continued. Thus, in this illustrative process flow, the contact ion implant regions 34AP are only formed on the P-type devices 10P and there is no corresponding contact ion implant regions 34A formed on the N-type devices 10N.

Figure 1O:
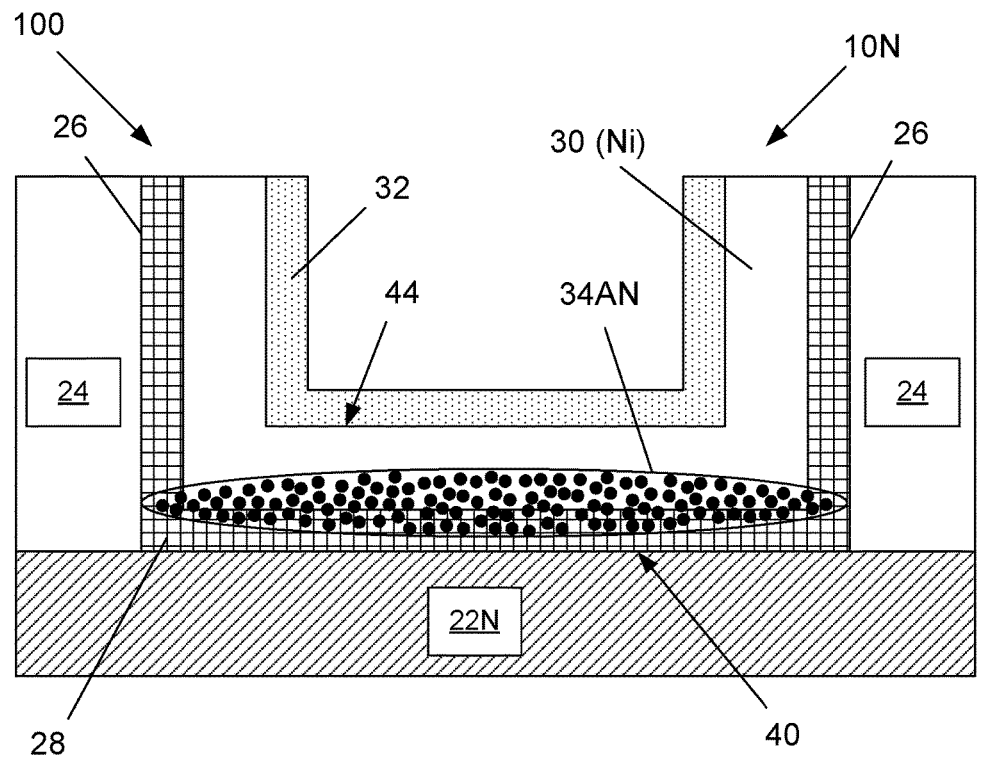
Figure 1O:
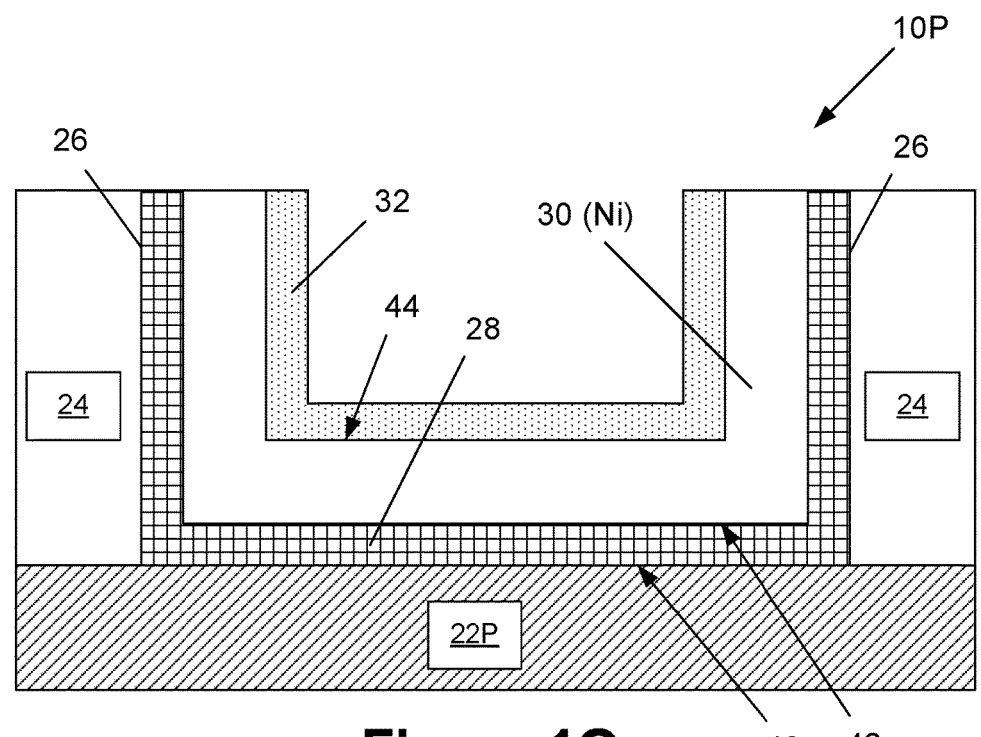

FIG. 1O depicts an example where the metal-containing layer 30 in both the N-type devices 10N and the P-type devices 10P is made of a P-type metal-containing layer (a P-friendly material) such as nickel. After the formation of the capping layer 32, an implant masking layer (not shown) may be formed so as to mask the P-type devices 10P. Thereafter, the above-described contact ion implantation process 34 may be performed using N-type ions 35, such as phosphorous (P), antimony (Sb), to form the depicted contact ion implant regions 34AN on the N-type devices 10N. The location of the peak concentration of ions 35 in the contact ion implant regions 34AN shown in FIG. 1O (e.g., approximately at the interface 42 between the metal-containing layer 30 and the layer of contact insulating material 28) is just by way of example only. Thereafter, the masking layer that covered the P-type devices 10P during the contact ion implantation process 34 may be removed and processing may be continued. Thus, in this illustrative process flow, the contact ion implant regions 34AN are only formed on the N-type devices 10N and there is no corresponding contact ion implant regions 34A formed on the P-type devices 10P.

Figure 1P:
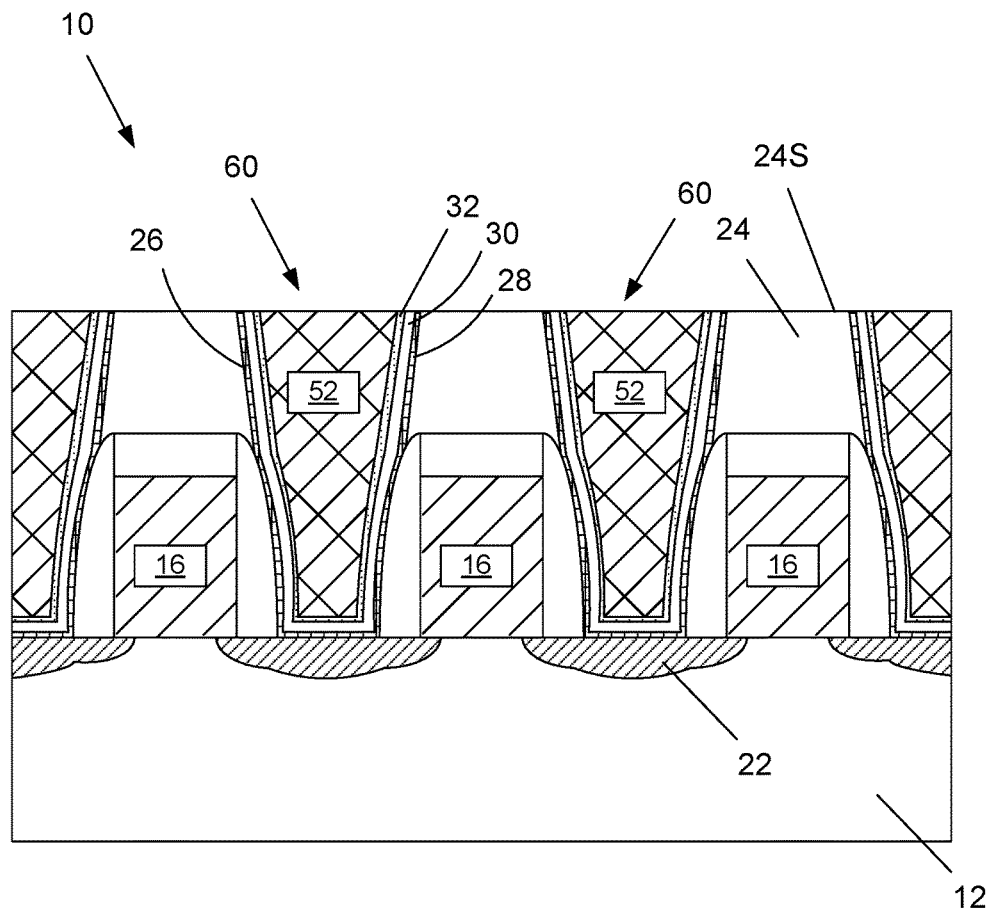

After the processing steps shown in FIGS. 1N-1O are completed, processing may continue with the formation of the conductive material 50, performing the anneal process 52, etc., as described above. FIG. 1P is an example of a device 10 wherein any of the various methods disclosed herein may be used to form self-aligned MIS contact structures 60.

As will be appreciated by those skilled in the art after a complete reading of the present application, the various methods and options discussed above provide device designers with greater flexibility in providing MIS contact structures on integrated circuit products. More specifically, using the methods disclosed herein, a device designer can, based upon selection of appropriate materials for at least the layer of contact insulating material 28 and the metal-containing layer 30 (e.g., selection of an N-type metal-containing layer of material or a P-type metal-containing layer), as well as the selection of the appropriate ions 35 (N-type or P-type) to be implanted during the contact ion implantation process 34, device designers can tailor the MIS contact structures 60 to maximize the performance of integrated circuit products.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming an MIS contact structure on an integrated circuit product comprising first and second transistors of opposite types, comprising:

forming first and second contact openings in at least one layer of insulating material, said first contact opening exposing a portion of a first source/drain (S/D) region of said first transistor, said second contact opening exposing a portion of a second S/D region of said second transistor;

performing a plurality of conformal deposition processes to form first, second and third layers of material within each of said first and second contact openings wherein:

said first layer comprises a contact insulating material, said first layer being positioned on said exposed portion of said first S/D region within said first contact opening and on said exposed portion of said second S/D region within said second contact opening;

said second layer comprises a metal-containing material, said second layer being positioned on said first layer in both said first and second contact openings; and said third layer comprises a conductive cap material, said third layer being positioned above said second layer in both said first and second contact openings;

forming an implant masking layer that masks said first contact opening while leaving said second contact opening exposed for further processing;

performing a contact ion implantation process through said implant masking layer to form a contact ion implant region comprising a contact ion that is positioned at least partially in at least one of said first, second or third layers of material positioned within said second contact opening;

removing said implant masking layer;

forming a fourth layer of material comprising a conductive material above said third layer in both said first and second contact openings such that said fourth layer overfills said first and second contact openings; and performing at least one process operation to remove portions of said first, second, third and fourth layers of material positioned outside of said first and second contact openings to define a first MIS contact structure positioned in said first contact opening and a second MIS contact structure positioned in said second contact opening.

2. The method of claim 1, wherein said third layer is formed on and in contact with said second layer.

3. The method of claim 1, wherein said first layer comprises one of a high-k insulating material (k value of 10 or greater), zirconium oxide ($ZrO_2$), hafnium oxide ($HfO_2$), hafnium zirconium oxide ($HfZrO_x$), $HfSiO_xN_y$, niobium oxide ($Nb_xO_y$), cerium oxide ($CeO_2$), tantalum oxide ($Ta_2O_5$), titanium tantalum oxide ($TiTa_xO_y$), strontium titanate (SrTiO$_3$), aluminum oxide (Al$_2$O$_3$), nickel oxide (Ni$_x$O$_y$), titanium oxide (TiO$_2$), lanthanum oxide (La$_2$O$_3$) or zinc oxide (ZnO).

4. The method of claim 1, wherein said second layer comprises an N-type metal-containing layer of material and wherein performing said contact ion implantation process comprises performing said contact ion implantation process with a P-type ion.

5. The method of claim 1, wherein said second layer comprises a P-type metal-containing layer of material and wherein performing said contact ion implantation process comprises performing said contact ion implantation process with an N-type ion.

6. The method of claim 1, wherein said third layer comprises one of titanium nitride, nickel nitride, tungsten nitride or an electrically conductive metal nitride.

7. The method of claim 1, further comprising, after performing said contact ion implantation process, performing an anneal process at a temperature that falls within a range of about 250-850° C.

8. The method of claim 7, wherein said anneal process is performed prior to forming said fourth layer.

9. The method of claim 7, wherein said anneal process is performed after forming said fourth layer.

10. The method of claim 1, wherein said fourth layer comprises one of copper, tungsten, cobalt, nickel, or doped polysilicon.

11. The method of claim 1, wherein performing said contact ion implantation process comprises performing said contact ion implantation process with a dose of said contact ion that falls within a range of about 1×10$^{14}$-1×10$^{15}$ ion/cm$^2$ and at an energy level that falls within a range of about 0.1-10 keV.

12. The method of claim 1, wherein said first transistor is an N-type transistor, said second transistor is a P-type transistor, said second S/D region is a P-doped S/D region that is doped with a P-type dopant ion and wherein performing said contact ion implantation process comprises performing said contact ion implantation process with a contact ion that is different than said P-type dopant ion.

13. The method of claim 1, wherein said first transistor is an N-type transistor, said second transistor is a P-type transistor and wherein performing said contact ion implantation process comprises performing said contact ion implantation process with a contact ion comprising one of aluminum (Al), nickel (Ni), gallium (Ga) or nitrogen (N).

14. The method of claim 1, wherein said first transistor is a P-type transistor, said second transistor is an N-type transistor, said second S/D region is an N-doped S/D region that is doped with an N-type dopant ion and wherein performing said contact ion implantation process comprises performing said contact ion implantation process with a contact ion that is different than said N-type dopant ion.

15. The method of claim 1, wherein said first transistor is a P-type transistor, said second transistor is an N-type transistor and wherein performing said contact ion implantation process comprises performing said contact ion implantation process with a contact ion comprising one of phosphorous (P), magnesium (Mg) or antimony (Sb).

16. The method of claim 1, wherein said first transistor is an N-type transistor, said second transistor is a P-type transistor, said first layer comprises zirconium oxide, said second layer comprises an N-type metal-containing layer of material, said third layer comprises titanium nitride and wherein performing said contact ion implantation process comprises performing said contact ion implantation process with a contact ion comprising one of aluminum (Al), nickel (Ni), gallium (Ga) or nitrogen (N).

17. The method of claim 1, wherein said first transistor is a P-type transistor, said second transistor device is an N-type transistor, said first layer comprises zirconium oxide, said second layer comprises a P-type metal-containing layer, said third layer comprises titanium nitride and wherein performing said contact ion implantation process comprises performing said contact ion implantation process with a contact ion comprising one of phosphorous (P), magnesium (Mg) or antimony (Sb).

18. The method of claim 1, wherein said first and second MIS contact structures consist of the same materials arranged in the same order within each of said first and second MIS contact structures.

19. The method of claim 1, further comprising, after forming said second layer, masking said first contact opening and conformably depositing another layer of conductive material on said second layer within said second contact opening.

20. The method of claim 19, wherein said first and second MIS contact structures comprise different materials.

21. A method of forming an MIS contact structure on an integrated circuit product comprising first and second transistors of opposite types, comprising:

forming first and second contact openings in at least one layer of insulating material, said first contact opening exposing a portion of a first source/drain (S/D) region of said first transistor, said second contact opening exposing a portion of a second S/D region of said second transistor;

performing a plurality of conformal deposition processes to form first, second and third layers of material within each of said first and second contact openings wherein:

said first layer comprises a contact insulating material and said first layer is positioned on and in contact with said exposed portion of said first S/D region in said first contact opening and on said second S/D region in said second contact opening, said contact insulating material comprising one of zirconium oxide or hafnium oxide;

said second layer comprises a metal-containing material and said second layer is positioned on and in contact with said first layer in both said first and second contact openings; and said third layer comprises a conductive cap material and said third layer is positioned above said second layer in both said first and second contact openings;

forming an implant masking layer that masks said first contact opening while leaving said second contact opening exposed for further processing;

performing a contact ion implantation process through said implant masking layer to form a contact ion implant region comprising a contact ion that is positioned at least partially in at least one of said first, second or third layers of material positioned within said second contact opening;

removing said implant masking layer;

forming a fourth layer of material comprising a conductive material above said third layer in both said first and second contact openings such that said fourth layer overfills said first and second contact openings; and performing at least one process operation to remove portions of said first, second, third and fourth layers of material positioned outside of said first and second contact openings to define a first MIS contact structure positioned in said first contact opening and a second MIS contact structure positioned in said second contact opening, wherein said first and second MIS contact structures consist of the same materials arranged in the same order within each of said first and second MIS contact structures.

22. The method of claim 21, further comprising, after performing said contact ion implantation process, performing an anneal process at a temperature that falls within a range of about 250-850° C.

23. The method of claim 22, wherein said anneal process is performed prior to forming said fourth layer.

24. The method of claim 22, wherein said anneal process is performed after forming said fourth layer.

25. The method of claim 21, wherein said first transistor is an N-type transistor, said second transistor is a P-type transistor, said second S/D region is a P-doped S/D region that is doped with a P-type dopant ion and wherein performing said contact ion implantation process comprises performing said contact ion implantation process with a contact ion that is different than said P-type dopant ion.

26. The method of claim 21, wherein said first transistor is an N-type transistor, said second transistor is a P-type transistor and wherein performing said contact ion implantation process comprises performing said contact ion implantation process with a contact ion comprising one of aluminum (Al), nickel (Ni), gallium (Ga) or nitrogen (N).

27. The method of claim 21, wherein said first transistor is a P-type transistor, said second transistor is an N-type transistor, said second S/D region is an N-doped S/D region that is doped with an N-type dopant ion and wherein performing said contact ion implantation process comprises performing said contact ion implantation process with a contact ion that is different than said N-type dopant ion.

28. The method of claim 21, wherein said first transistor is a P-type transistor, said second transistor is an N-type transistor and wherein performing said contact ion implantation process comprises performing said contact ion implantation process with a contact ion comprising one of phosphorous (P), magnesium (Mg) or antimony (Sb).

29. The method of claim 21, wherein said first transistor is an N-type transistor, said second transistor is a P-type transistor, said first layer comprises zirconium oxide, said second layer comprises an N-type metal-containing layer of material, said third layer comprises titanium nitride and wherein performing said contact ion implantation process comprises performing said contact ion implantation process with a contact ion comprising one of aluminum (Al), nickel (Ni), gallium (Ga) or nitrogen (N).

30. The method of claim 21, wherein said first transistor is a P-type transistor, said second transistor is an N-type transistor, said first layer comprises zirconium oxide, said second layer comprises a P-type metal-containing layer, said third layer comprises titanium nitride and wherein performing said contact ion implantation process comprises performing said contact ion implantation process with a contact ion comprising one of phosphorous (P), magnesium (Mg) or antimony (Sb).

31. The method of claim 21, wherein said second layer comprises an N-type metal-containing layer of material and wherein performing said contact ion implantation process comprises performing said contact ion implantation process with a P-type ion.

32. The method of claim 21, wherein said second layer comprises a P-type metal-containing layer of material and wherein performing said contact ion implantation process comprises performing said contact ion implantation process with an N-type ion.

\* \* \* \* \*